(12) United States Patent  
Maki (10) Patent No.: US 9,130,579 B2  
(45) Date of Patent: Sep. 8, 2015

(54) ATOMIC OSCILLATOR AND MANUFACTURING METHOD OF THE ATOMIC OSCILLATOR

(71) Applicant: Seiko Epson Corporation, Tokyo (JP)

(72) Inventor: Yoshiyuki Maki, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/199,305

(22) Filed: Mar. 6, 2014

(65) Prior Publication Data

US 2014/0292426 A1 Oct. 2, 2014

(30) Foreign Application Priority Data

Mar. 27, 2013 (JP) .................................. 2013-065633

(51) Int. Cl.
*G04F 5/14* (2006.01)
*H03B 17/00* (2006.01)
*H03L 7/26* (2006.01)

(52) U.S. Cl.
CPC *H03L 7/26* (2013.01); *G04F 5/145* (2013.01); *H03B 17/00* (2013.01); *Y10T 29/4902* (2015.01)

(58) Field of Classification Search
CPC ............. G04F 5/14; G04F 5/145; H01S 1/06; H03B 17/00; H03L 7/26

USPC ...................................................... 331/3, 94.1
See application file for complete search history.

(56) References Cited

U.S. PATENT DOCUMENTS

| 6,300,841 | B1 | 10/2001 | Atsumi et al. | |
| 6,320,472 | B1 | 11/2001 | Vanier | |
| 6,426,679 | B1 * | 7/2002 | Oblak et al. | 331/3 |
| 6,710,663 | B1 * | 3/2004 | Berquist | 331/3 |
| 8,121,569 | B2 * | 2/2012 | Perry et al. | 455/192.1 |
| 8,736,326 | B1 * | 5/2014 | Horng et al. | 327/156 |

FOREIGN PATENT DOCUMENTS

| JP | 2001-036405 A | 2/2001 |
| JP | 2011-244120 | 12/2011 |

* cited by examiner

*Primary Examiner* — Levi Gannon
(74) *Attorney, Agent, or Firm* — Harness, Dickey & Pierce, P.L.C.

(57) ABSTRACT

An atomic oscillator includes an atomic cell in which an atom is enclosed, a magnetic field generation part to apply a magnetic field to the atomic cell, a reference oscillator which is controlled based on an atomic resonance signal outputted from the atomic cell and generates a reference signal, and a fractional N-PLL which receives the reference signal to generate a signal including a resonance frequency of the atom, in which when a maximum digit of the resonance frequency adjustable by the magnetic field generation part is a boundary digit, the fractional N-PLL can adjust at least a digit one digit higher than the boundary digit.

9 Claims, 10 Drawing Sheets

| BUFFER GAS PRESSURE OF GAS CELL [Torr] | REGISTER VALUE OF DECIMAL SETTING PART (25 bit) | COIL CURRENT [A] | OUTPUT FREQUENCY [MHz] |
|---|---|---|---|
| $1.1 \times P_0$ | 1_1010_1011_1111_1010_1011_1111 | 5.5 | 10.000543 |
| $P_0$ | 1_0111_0011_0001_1110_0000_1111 | 5.8 | 10.000436 |
| $0.9 \times P_0$ | 0_0110_0111_1000_0110_0111_1111 | 6.1 | 10.000324 |

ATOMIC OSCILLATOR AND MANUFACTURING METHOD OF THE ATOMIC OSCILLATOR

BACKGROUND

1. Technical Field

The present invention relates to an atomic oscillator and a manufacturing method of the atomic oscillator.

2. Related Art

In recent years, an information equipment, such as a cellular phone or a smartphone, is improved to attain high performance and multi-functionality, and a request for frequency accuracy and frequency stability of an oscillator used for data communication becomes more and more severe. As the oscillator to satisfy the high request, an atomic oscillator using a resonance phenomenon of an atom such as rubidium or cesium is widely used.

As the atomic oscillator, there is known one using an EIT (Electromagnetically Induced Transparency) phenomenon which occurs when two kinds of resonant lights whose frequency difference is coincident with the resonance frequency are simultaneously irradiated to the atom or one using an optical micro double resonance phenomenon which occurs when exciting light is irradiated to the atom and a microwave coincident with the resonance frequency of the atom is applied to a cavity resonator. In both the cases, the oscillation frequency of a voltage controlled oscillator is controlled according to the intensity of light passing through an atomic cell, and the oscillation signal is frequency-converted, so that the signal of the resonance frequency of the atom is obtained.

Here, for example, when an oscillation signal of a voltage controlled oscillator is desired to be made an accurately desired frequency (for example, 10 MHz) as an output signal of an atomic oscillator, since the resonance frequency of a rubidium atom is 6.8346826128 GHz, and the resonance frequency of a cesium atom is 9.192631770 GHz, the resonance frequency of the atom is not an integer times larger than the oscillation frequency of the voltage controlled oscillator.

In the invention of JP-A-2001-36405 (Patent Literature 1), a desired resonance frequency signal can be obtained without using an LC tank circuit using a coil and a capacitor or a passive multiplication circuit such as a varactor diode. Accordingly, it is unnecessary to perform adjustment such as impedance matching between a low-order multiplier and the atomic oscillator, and it is also unnecessary to generate the resonance frequency of the rubidium atom by using amplitude modulation. Accordingly, the atomic oscillator can be miniaturized, the manufacturing period can be shortened, and the manufacturing cost can be reduced.

Here, in the atomic oscillator, there is a manufacturing variation in pressure of a buffer gas such as Neon (Ne) or Argon (Ar) to be injected into an atomic cell (gas cell). Since the shift amount of the resonance frequency also varies with the manufacturing variation of the buffer gas, in order to obtain the desired frequency as the output signal, in the invention of Patent Literature 1, a direct digital synthesizer (Hereinafter referred to as DDS) is required to be provided. However, when the DDS is used, the waveform of the output signal deteriorates.

SUMMARY

An advantage of some aspects of the invention is to provide an atomic oscillator and a manufacture method of the atomic oscillator, in which without deteriorating a waveform of an output signal, a variation in shift amount of a resonance frequency due to a manufacturing variation of a buffer gas can be adjusted for all digits of the resonance frequency requiring adjustment, and the increase of a circuit scale can also be suppressed.

The invention can be implemented as the following aspects or application examples.

APPLICATION EXAMPLE 1

This application example of the invention is directed to an atomic oscillator including an atomic cell in which an atom is enclosed, a magnetic field generation part to apply a magnetic field to the atomic cell, a reference oscillator which is controlled based on an atomic resonance signal outputted from the atomic cell and generates a reference signal, and a fractional N-PLL which receives the reference signal to generate a signal including a resonance frequency of the atom, in which when a maximum digit of the resonance frequency adjustable by the magnetic field generation part is a boundary digit, the fractional N-PLL can adjust the resonance frequency at at least a digit one digit higher than the boundary digit.

The atomic oscillator according to this application example includes the atomic cell, the magnetic field generation part, the reference oscillator, and the fractional N-PLL. Here, the fractional N-PLL is a PLL (Phase Locked Loop) of a fractional frequency dividing system. The fractional N-PLL can realize frequency division at a fraction (number including a value smaller than a decimal point) on the average by changing a frequency division ratio (integer ratio) in a time-division manner. In the atomic oscillator, when an output signal of a frequency having no fraction, such as 10 MHz, is desired, the frequency and the resonance frequency are not in an integer multiple relation. However, since the atomic oscillator of this application example includes the fractional N-PLL, an output signal of a frequency having no fraction can be generated without using a DDS, and the waveform of the output signal is not deteriorated.

However, in order to deal with the variation in the shift amount of the resonance frequency due to the manufacturing variation of the buffer gas, adjustment may be required up to a digit after the decimal point of the resonance frequency. At this time, if the digit after the decimal point of the resonance frequency of GHz order is adjusted by only the fractional N-PLL, a circuit scale is increased.

Then, in the atomic oscillator of this application example, the maximum digit of the resonance frequency adjustable by the magnetic field generation part is made the boundary digit, and the fractional N-PLL is made to be capable of adjusting at least the digit higher than the boundary digit of the resonance frequency. At this time, although all the digits of the resonance frequency requiring adjustment can be adjusted, the fractional N-PLL has only to adjust the range which can not be adjusted by the magnetic field generation part. Accordingly, the increase of the circuit scale can be suppressed.

For example, if the boundary digit is the ones digit of the resonance frequency, the fractional N-PLL adjusts apart of the resonance frequency not smaller than the tens digit, and the magnetic field generation part adjusts the ones digit and digits after the decimal point of the resonance frequency.

APPLICATION EXAMPLE 2

The atomic oscillator according to the application example described above may be configured such that the fractional N-PLL includes an n-bit decimal setting part to determine a decimal part of a frequency division ratio, and when a bit number of the decimal setting part is n, a phase comparison frequency is $f_{PFD}$, the resonance frequency is $f_{\Delta E}$, and an adjustable ratio of the magnetic field generation part to the resonance frequency is $R_M$, equation (1) is satisfied.

$$\frac{f_{PFD}}{2^n} \leq f_{\Delta E} \times R_M \quad (1)$$

APPLICATION EXAMPLE 3

The atomic oscillator according to the application example described above may be configured such that the fractional N-PLL includes a decimal setting part of at least 25 bits.

The fractional N-PLL of the atomic oscillator according to this application example includes the n-bit decimal setting part to determine the decimal part of the frequency division ratio, and n of the bit number of the decimal setting part may satisfy the expression (1). At this time, the fractional N-PLL can adjust at least the digit higher than the boundary digit of the resonance frequency. The fractional N-PLL can realize frequency division by a fraction, and the decimal setting part sets the decimal part except the integer part of the frequency division ratio. For example, the decimal setting part may be an n-bit register (values of 0 to $2^n-1$ can be set), and a value obtained by dividing the value of the register by $2^n$ may be the decimal part of the frequency division ratio.

Incidentally, the phase comparison frequency is a frequency in a phase comparator included in the fractional N-PLL. Besides, the adjustable ratio is a ratio with respect to the resonance frequency, and is a value indicating an adjustable range. For example, when $R_M$ of the adjustable ratio of the magnetic field generation part is $10^{-9}$, the resonance frequency of the cesium atom is about 9 GHz, and a single-digit value is obtained by multiplying these. At this time, the boundary digit as the maximum digit of the resonance frequency adjustable by the magnetic field generation part is the ones digit.

At this time, n of the bit number of the decimal setting part required in the fractional N-PLL can be easily obtained by using the expression (1). On the contrary, if the expression (1) is satisfied, the fractional N-PLL can adjust at least the digit higher than the boundary digit of the resonance frequency. Thus, it does not occur that n is unnecessarily increased and the circuit scale is increased.

Here, it is assumed that the phase comparison frequency $f_{PFD}$ is 10 MHz. When the magnetic field generation part is a coil to generate a C magnetic field, $R_M$ is, for example, $10^{-9}$. Then, since the resonance frequencies of the rubidium atom and the cesium atom are respectively about 6 GHz and about 9 GHz, n=25 satisfies the expression (1). Accordingly, as a realistic structure, the fractional N-PLL may include a 25-bit decimal setting part. Incidentally, the C magnetic field is a static magnetic field uniformly applied in a direction perpendicular to the traveling direction of a laser beam.

APPLICATION EXAMPLE 4

This application example of the invention is directed to a manufacturing method of an atomic oscillator including an atomic cell in which an atom is enclosed, a magnetic field generation part as a coil to apply a magnetic field to the atomic cell, a reference oscillator which is controlled based on an atomic resonance signal outputted from the atomic cell and generates a reference signal, and a fractional N-PLL which includes an n-bit decimal setting part to determine a decimal part of a frequency division ratio and receives the reference signal to generate a signal including a resonance frequency of the atom. The manufacturing method of the atomic resonator includes determining n of a bit number of the decimal setting part of the fractional N-PLL, in which a maximum digit of the resonance frequency adjustable by the magnetic field generation part is a boundary digit, and the fractional N-PLL can adjust at least a digit one digit higher than the boundary digit.

APPLICATION EXAMPLE 5

This application example of the invention is directed to a manufacturing method of an atomic oscillator including an atomic cell in which an atom is enclosed, a magnetic field generation part as a coil to apply a magnetic field to the atomic cell, a reference oscillator which is controlled based on an atomic resonance signal outputted from the atomic cell and generates a reference signal, and a fractional N-PLL which includes an n-bit decimal setting part to determine a decimal part of a frequency division ratio and receives the reference signal to generate a signal including a resonance frequency of the atom. The manufacturing method of the atomic oscillator includes determining at least one of a number of turns and a current of the magnetic field generation part such that the magnetic field generation part can adjust at least a digit not higher than a boundary digit of the resonance frequency, the boundary digit being a digit one digit lower than a minimum digit of the resonance frequency adjustable by the fractional N-PLL.

APPLICATION EXAMPLE 6

The manufacturing method of the atomic oscillator according to the application example described above may be configured such that the method further includes giving an initial value to the n-bit decimal setting part of the fractional N-PLL, and adjusting the value set in the decimal setting part.

APPLICATION EXAMPLE 7

The manufacturing method of the atomic oscillator according to the application example described above may be configured such that the method further includes adjusting the current of the magnetic field generation part.

According to the manufacturing method of the atomic oscillator of this application example, n of an appropriate bit number of the decimal setting part of the fractional N-PLL can be determined, and at least one of the number of turns and the current of the magnetic field generation part to determine the boundary digit can be determined. After the atomic oscillator is assembled, the initial value of the n-bit decimal setting part is appropriately adjusted, or the current of the magnetic field generation part is adjusted, so that a desired frequency of an output signal (hereinafter referred to as an output frequency) can be obtained.

According to the manufacturing method of the atomic oscillator of this application example, the atomic oscillator can be manufactured in which without deteriorating the waveform of the output signal, the variation in the shift amount of the resonance frequency due to the manufacturing variation of the buffer gas can be adjusted for all digits of the resonance frequency requiring adjustment, and the increase of a circuit scale can also be suppressed.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a preferable embodiment of the invention will be described in detail with reference to the drawings. Incidentally, the embodiment described below does not unduly limit the content of the invention recited in the appended claims. Besides, all components described below are not necessarily indispensable components of the invention.

1. Atomic Oscillator
Structure of the Atomic Oscillator

Figure 1:
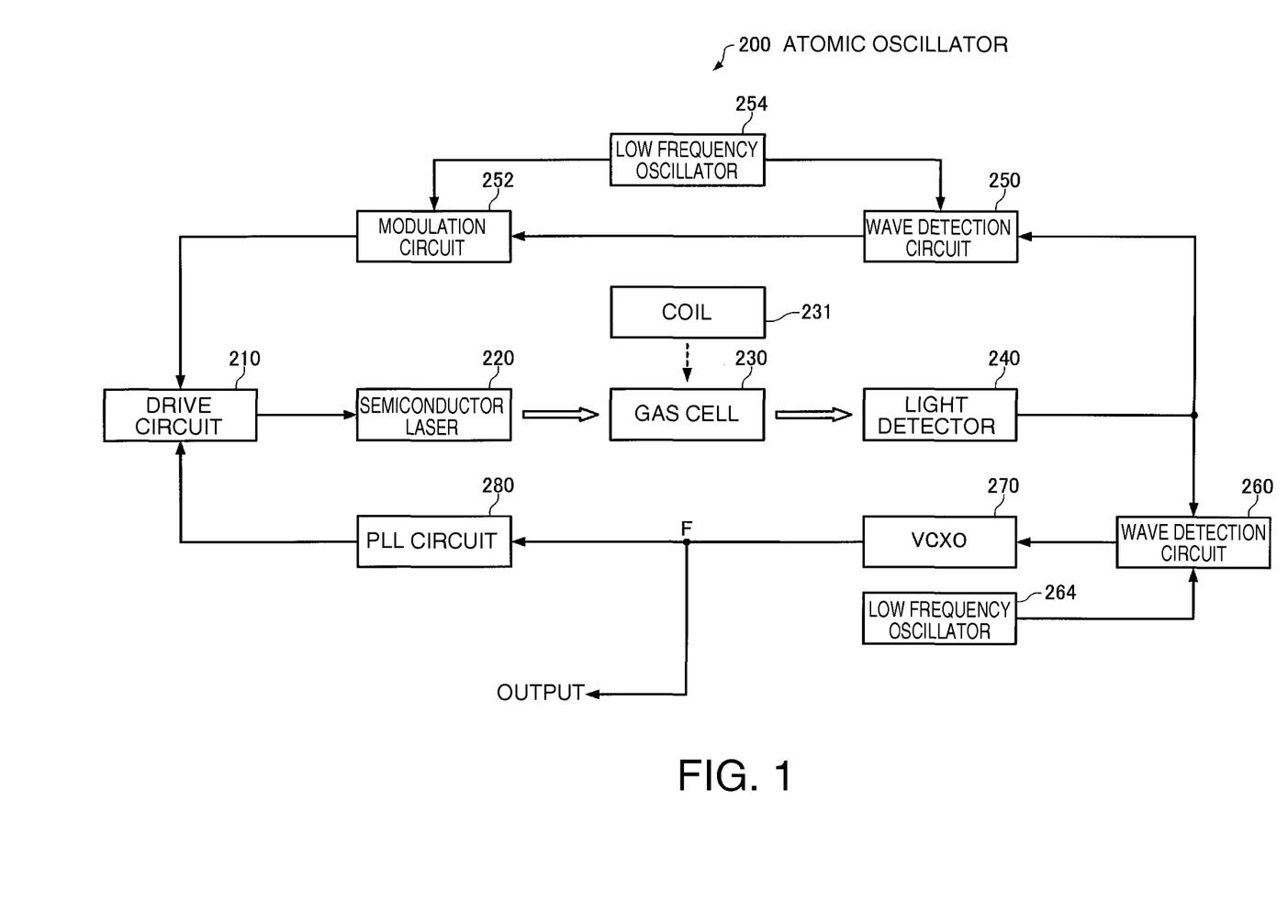
FIG. 1 is a view showing a structural example of an atomic oscillator of an embodiment.

FIG. 1 is a view showing a structural example of an atomic oscillator 200 of an embodiment using an EIT phenomenon of an alkali metal atom. As shown in FIG. 1, the atomic oscillator 200 of this embodiment includes a drive circuit 210, a semiconductor laser 220, a gas cell 230, a coil 231, a light detector 240, a wave detection circuit 250, a modulation circuit 252, a low frequency oscillator 254, a wave detection circuit 260, a low frequency oscillator 264, a voltage controlled crystal oscillator (VCXO 270) and a PLL circuit 280. Here, the gas cell 230 corresponds to an atomic cell according to the invention. The coil 231 corresponds to a magnetic field generation part according to the invention. The VCXO 270 corresponds to a reference oscillator according to the invention. The PLL circuit 280 corresponds to a fractional N-PLL according to the invention. Incidentally, in the atomic oscillator of this embodiment, part of the components (respective parts) of FIG. 1 may be appropriately omitted or modified, and another component may be added.

The gas cell 230 (atomic cell) is such that gaseous alkali metal atoms (sodium (Na) atoms, rubidium (Rb) atoms, cesium (Cs) atoms, etc.) are enclosed in a container made of a transparent member such as glass.

The semiconductor laser 220 generates light including two light waves which are a resonant light pair to cause the EIT phenomenon to occur in the alkali metal atoms contained in the gas cell 230. As the semiconductor laser 220, an edge emitting laser, a surface emitting laser such as a VCSEL (Vertical Cavity Surface Emitting Laser), or the like can be used. The light generated by the semiconductor laser 220 is incident on the gas cell 230.

The coil 231 generates a C magnetic field to cause the Zeeman fission to occur in the alkali metal atoms contained in the gas cell 230. Here, the C magnetic field is a static magnetic field uniformly applied in a direction perpendicular to the traveling direction of the light generated by the semiconductor laser 220.

The light passing through the gas cell 230 is incident on the light detector 240, and the light detector outputs a detection signal corresponding to the intensity of the incident light. The light detector 240 can be realized by using, for example, a photo diode (PD) to output a detection signal corresponding to the intensity of received light. The output signal of the light detector 240 is inputted to the wave detection circuit 250 and the wave detection circuit 260.

The wave detection circuit 250 uses an oscillation signal of the low frequency oscillator 254 oscillating at a low frequency of several Hz to several hundred Hz and synchronously detects the output signal of the light detector 240. In order to enable synchronous detection of the wave detection circuit 250, the modulation circuit 252 modulates the output signal of the wave detection circuit 250 by using the oscillation signal (the same signal as the oscillation signal supplied to the wave detection circuit 250) of the low frequency oscillator 254 as the modulation signal and outputs to the drive circuit 210. The modulation circuit 252 can be realized by a frequency mixer (mixer), an FM (Frequency Modulation) circuit, an AM (Amplitude Modulation) circuit or the like.

The wave detection circuit 260 synchronously detects the output signal of the light detector 240 by using the oscillation signal of the low frequency oscillator 264 oscillating at a low frequency of several Hz to several hundred Hz. The oscillation frequency of the VCXO 270 is finely adjusted according to the magnitude of the output signal of the wave detection circuit 260. In the atomic oscillator 200 of this embodiment, it is assumed that the desired output frequency F of the VCXO 270 is 10 MHz. The PLL circuit 280 frequency-converts the output signal of the VCXO 270 and outputs to the drive circuit 210.

The drive circuit 210 sets a bias current of the semiconductor laser 220, finely adjusts the bias current according to the output signal of the modulation circuit 252 and supplies to the semiconductor laser 220. That is, the center wavelength $\lambda_0$ (center frequency $f_0$) of the light generated by the semiconductor laser 220 is finely adjusted by a feedback loop (first feedback loop) passing through the semiconductor laser 220, the gas cell 230, the light detector 240, the wave detection circuit 250, the modulation circuit 252 and the drive circuit 210. Specifically, the feedback control is performed by the first feedback loop so that with respect to a wavelength $\lambda_1$ ($=v/f_1$: v is the speed of light) corresponding to an energy difference between an excited level of the alkali metal atom enclosed in the gas cell 230 and one of ground levels, and a wavelength $\lambda_2$ ($=v/f_2$) corresponding to an energy difference between the excited level and the other of the ground levels, a center wavelength $\lambda_0$ ($=v/f_0$) of outgoing light of the semiconductor laser 220 is almost coincident with ($\lambda_1+\lambda_2$)/2 (the center frequency $f_0$ is almost coincident with ($f_1+f_2$)/2).

The drive circuit 210 further superimposes a current (modulation current) of an output frequency component (modulation frequency $f_m$) of the PLL circuit 280 on the bias current and supplies to the semiconductor laser 220. Frequency modulation is applied to the semiconductor laser 220 by this modulation current, and in addition to the light of the center frequency $f_0$, lights of frequencies $f_0 \pm f_m$, $f_0 \pm 2f_m$, . . .

shifted to both sides by $f_m$ are generated. Then, fine adjustment is performed by a feedback loop (second feedback loop) passing through the semiconductor laser 220, the gas cell 230, the light detector 240, the wave detection circuit 260, the VCXO 270, the PLL circuit 280 and the drive circuit 210, so that the light of frequency $f_0+f_m$ and the light of frequency $f_0-f_m$ become a resonant light pair to cause the EIT phenomenon to occur in the alkali metal atom enclosed in the gas cell 230, that is, the output frequency $f_m$ of the PLL circuit 280 is accurately coincident with ½ of a frequency (resonance frequency) $f_{12}$ corresponding to an energy difference $\Delta E_{12}$ between the two ground levels of the alkali metal atom. For example, if the alkali metal atom is a cesium atom, since the resonance frequency $f_{12}$ is 9.192631770 GHz, a stable state is obtained when the output frequency $f_m$ of the PLL circuit 280 is coincident with 4.596315885 GHz.

By the structure as stated above, the atomic oscillator 200 of this embodiment can ideally obtain the desired output frequency F. However, practically, as described later, it is necessary to adjust the variation in shift amount of the resonance frequency due to the manufacturing variation of the buffer gas of the gas cell 230. Incidentally, in the atomic oscillator 200 of this embodiment, the fractional N-PLL is used as the PLL circuit 280, and the waveform of the output signal does not deteriorate unlike a case of using, for example, a DDS.

PLL Circuit

Figure 2:
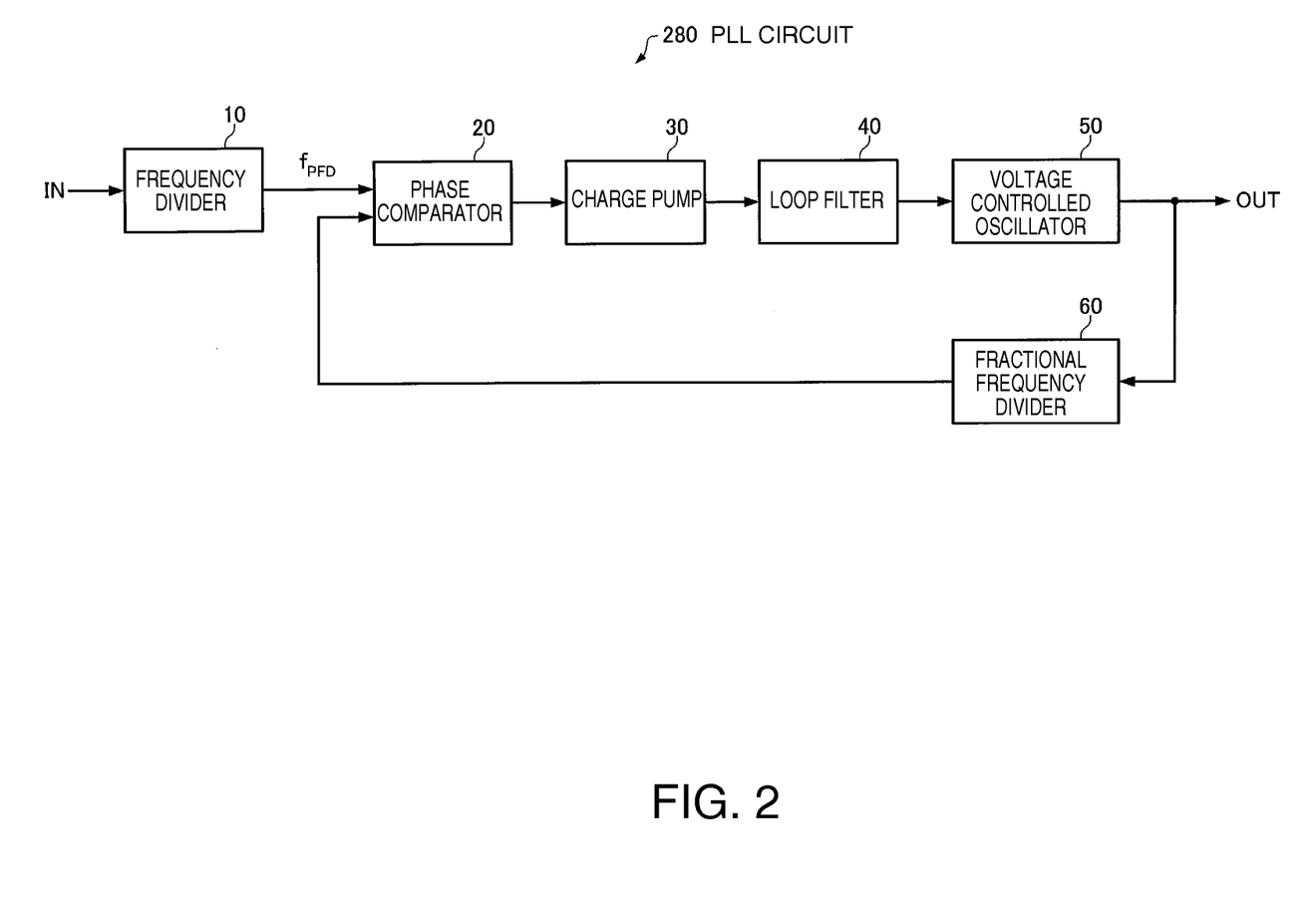
FIG. 2 is a view showing a structural example of a PLL circuit of the embodiment.

FIG. 2 is a view showing a structural example of the PLL circuit 280 of this embodiment. As shown in FIG. 2, the PLL circuit 280 includes a frequency divider 10, a phase comparator 20, a charge pump 30, a loop filter 40, a voltage controlled oscillator 50 (VCO) and a fractional frequency divider 60. Incidentally, in the PLL circuit 280, although the frequency divider 10 performs frequency division by an integer, and the fractional frequency divider 60 performs frequency division by a fraction, the opposite structure is also possible.

An input signal (IN of FIG. 2) to the PLL circuit 280 is the output signal of the VCXO 270, and an output signal (OUT of FIG. 2) from the PLL circuit 280 is outputted to the drive circuit 210. Besides, a phase comparison frequency as a frequency of a signal inputted to the phase comparator 20 is $f_{PFD}$ of expression (1) described later in detail.

The frequency divider 10 frequency-divides the frequency of the input signal (IN of FIG. 2) to 1/R and outputs. At this time, R is an integer not smaller than 1, and is variably set within a specified range by the set value of a not-shown register.

The phase comparator 20 compares the phase of the output signal of the frequency divider 10 with the phase of the output signal of the fractional frequency divider 60, and outputs a signal corresponding to the phase difference. Specifically, when the phase of the output signal of the frequency divider 10 is earlier than the phase of the output signal of the fractional frequency divider 60, a positive pulse signal of a pulse width corresponding to the phase difference is outputted, and in the opposite case, a negative pulse signal of a pulse width corresponding to the phase difference is outputted.

The charge pump 30 charges/discharges a not-shown capacitor in the loop filter 40 according to the output signal of the phase comparator 20. Specifically, when the phase comparator 20 outputs the positive pulse signal, the charge pump 30 charges electric charge corresponding to the pulse width to the capacitor. When the phase comparator 20 outputs the negative pulse signal, the charge pump 30 discharges electric charge corresponding to the pulse width from the capacitor.

The loop filter 40 is an integration circuit constructed by using a not-shown resistor and capacitor, and smooths a pulse-like current generated by the charge pump 30. Accordingly, the phase comparator 20 outputs the positive pulse signal, the output voltage of the loop filter 40 increases, and when the phase comparator 20 outputs the negative pulse signal, the output voltage of the loop filter 40 decreases.

The voltage controlled oscillator 50 is an oscillator oscillating at a frequency corresponding to the voltage of the loop filter 40 (accordingly, corresponding to the output signal of the phase comparator 20). Specifically, when the phase of the output signal of the frequency divider 10 is earlier than the phase of the output signal of the fractional frequency divider 60, the voltage of the loop filter 40 increases, and the frequency of the voltage controlled oscillator 50 also increases. In the opposite case, the voltage of the loop filter 40 decreases, and the frequency of the voltage controlled oscillator 50 also decreases. The output signal of the voltage controlled oscillator 50 is the output signal (OUT of FIG. 2) of the PLL circuit 280.

The fractional frequency divider 60 divides the frequency of the output signal of the voltage controlled oscillator 50 by K/L and outputs. K and L are integers not smaller than 1 and are variably set within a specified range by a set value of a not-shown register.

Here, the PLL circuit 280 includes a register to set the integer part of K/L as the frequency division ratio and a register (corresponding to a decimal setting part according to the invention) to set the decimal part. Here, the register to set the decimal part has an n-bit (n is an integer not lower than 1), and a value obtained by dividing the value of the register by $2^n$ is the decimal part of the frequency division ratio.

At this time, the resolution of the frequency of the output signal of the PLL circuit 280 is a value obtained by dividing $f_{PFD}$ by $2^n$, where $f_{PFD}$ is the phase comparison frequency. For example, when $f_{PFD}$ is 10 MHz, and n is 10, 15, 20, 25, 30 or 35, a frequency step of 9766 Hz, 305 Hz, 9.54 Hz, 0.298 Hz, 0.00931 Hz or 0.000291 Hz can be set.

For example, when the influence of the manufacturing variation of the buffer gas is corrected, for example, it is preferable that a frequency can be adjusted to the third decimal place. If the frequency is adjusted to the third decimal place by setting the frequency division ratio of the PLL circuit 280, n is required to be made 34 (that is, the register as the decimal setting part is made to have 34 bits). However, when n is expanded to 34 bits, there is a possibility that a circuit scale becomes large. Then, in view of the other adjustment unit included in the atomic oscillator 200 of this embodiment, n of the bit number of the decimal setting part is preferably made an appropriate value so that the increase of the circuit scale can also be suppressed.

Frequency Adjustment by the Coil

Figure 3:
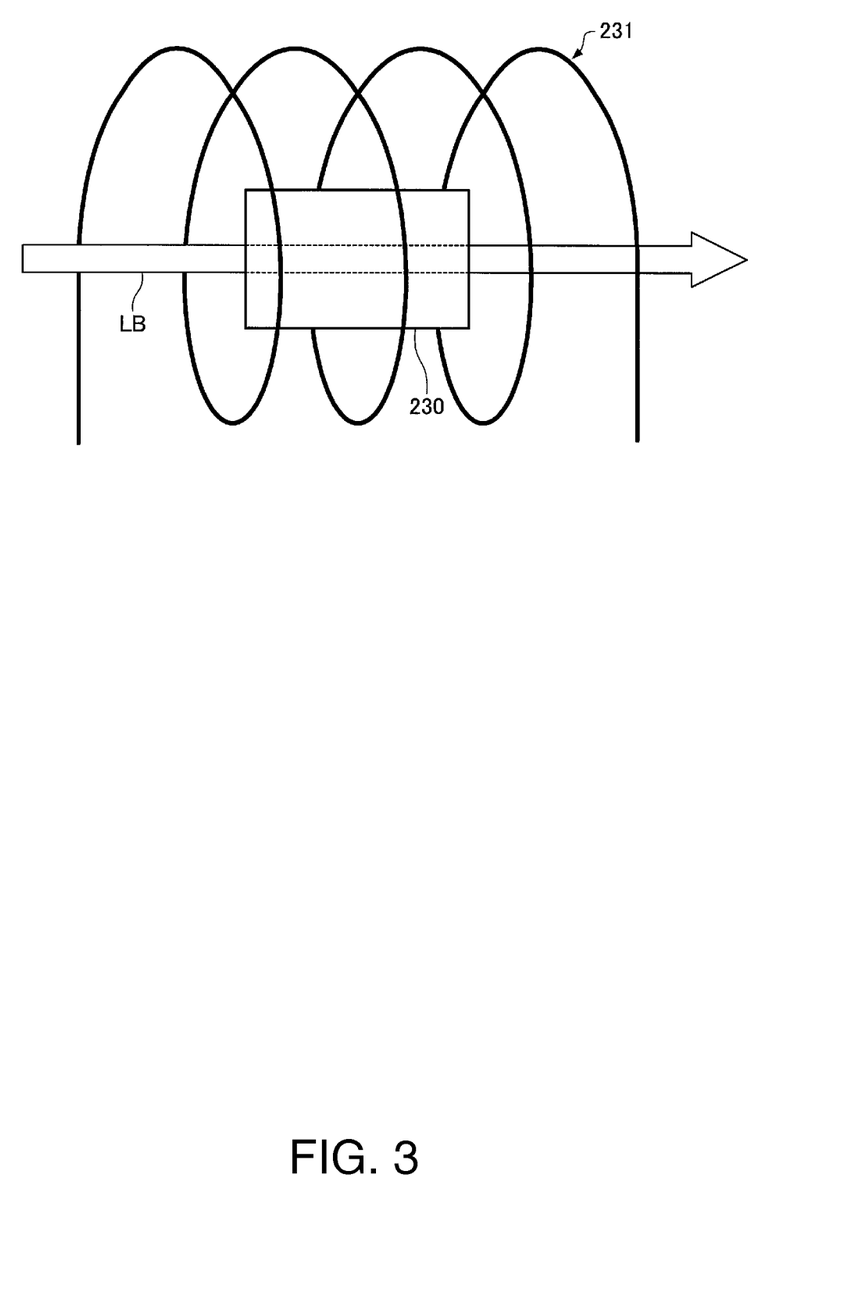
FIG. 3 is a view for explaining a coil.

FIG. 3 is a view for explaining the coil 231 included in the atomic oscillator 200. The coil 231 is provided so as to surround the gas cell 230, and generates the static magnetic field (C magnetic field) uniformly applied in the direction perpendicular to the traveling direction of the laser beam LB generated by the semiconductor laser 220. A current of a magnitude corresponding to a set value stored in a not-shown memory flows through the coil 231. Thus, the C magnetic field having desired intensity can be generated according to the magnitude of the current.

Figure 4A:
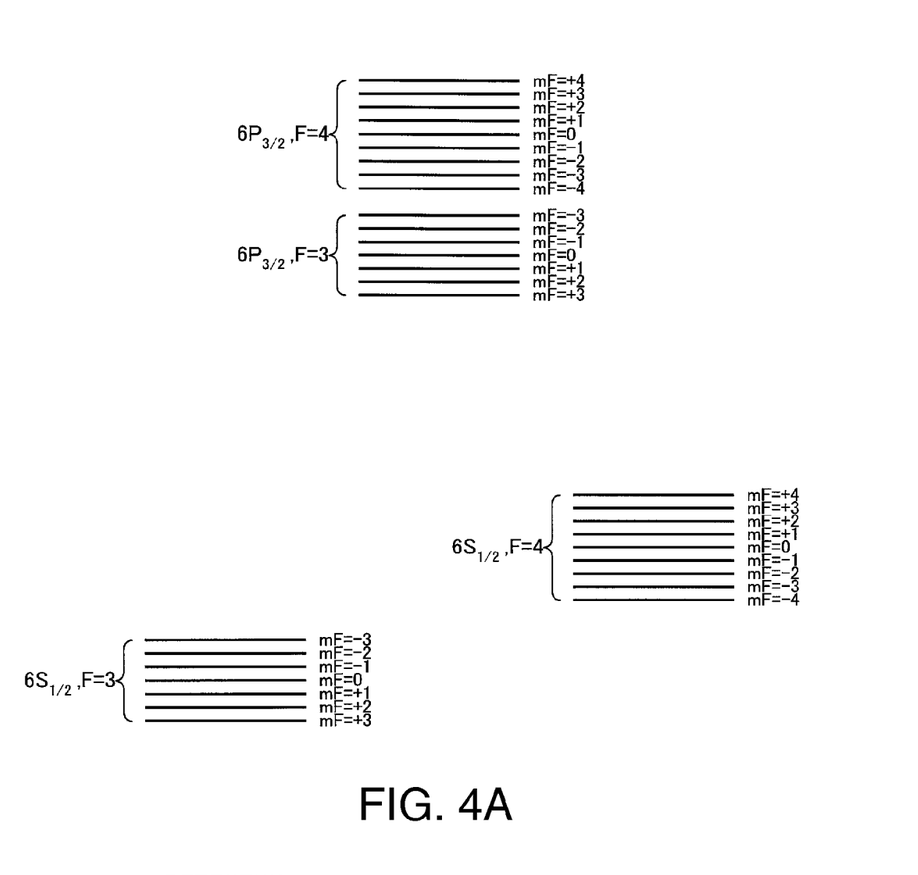
FIG. 4A is a view showing energy levels after Zeeman fission.

When the C magnetic field is applied to the gas cell 230, each energy level of the alkali metal atom is divided into 2F+1 levels (Zeeman fission). For example, as shown in FIG. 4A, in the case of the cesium atom, the ground level of $6S_{1/2}$, F=3 and the excited level of $6P_{3/2}$, F=3 are respectively divided into seven levels corresponding to the magnetic quantum numbers mF=0, ±1, ±2 and ±3. The ground level of $6S_{1/2}$, F=4 and the excited level of $6P_{3/2}$, F=4 are respectively divided into nine levels corresponding to the magnetic quantum numbers mF=0, ±1, ±2, ±3 and ±4.

Figure 4B:
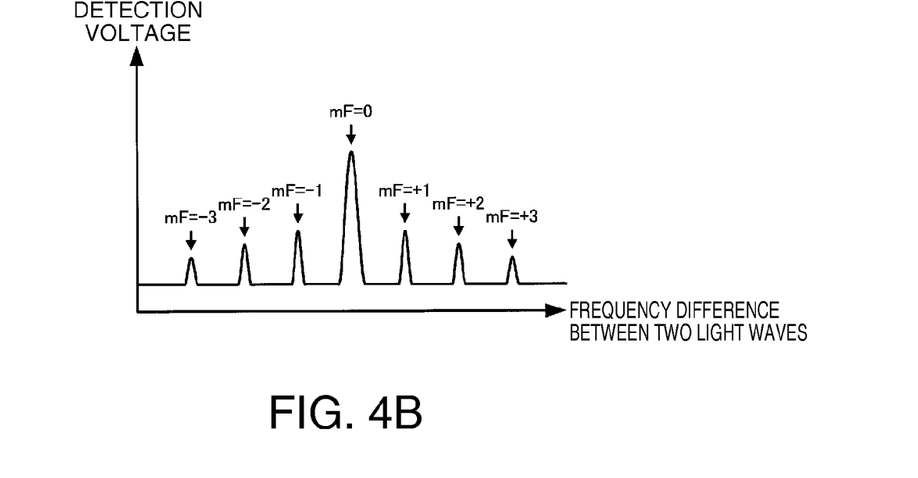
FIG. 4B is a view showing an example of an EIT signal after Zeeman fission.

It is known that a frequency (frequency difference) of a resonant light pair to cause the EIT phenomenon to occur in the alkali metal atom varies for each magnetic quantum number mF. That is, in the state where the magnetic field is applied to the gas cell 230, when the frequency difference of the two light waves emitted from the semiconductor laser 220 is swept, plural peaks, that is, plural EIT signals are observed in the output of the light detector 240. For example, as shown in FIG. 4B, in the case of the cesium atom, seven EIT signals corresponding to the magnetic quantum numbers mF=0, ±1, ±2 and ±3 are observed. In FIG. 4B, the horizontal axis indicates the frequency difference of two light waves to be swept, and the vertical axis indicates the intensity of light detected by the light detector 240. As shown in FIG. 4B, in general, since the intensity of the EIT signal corresponding to mF=0 is highest, the frequency difference of the resonant light pair is controlled so that the EIT signal corresponding to mF=0 is generated.

Figure 5:
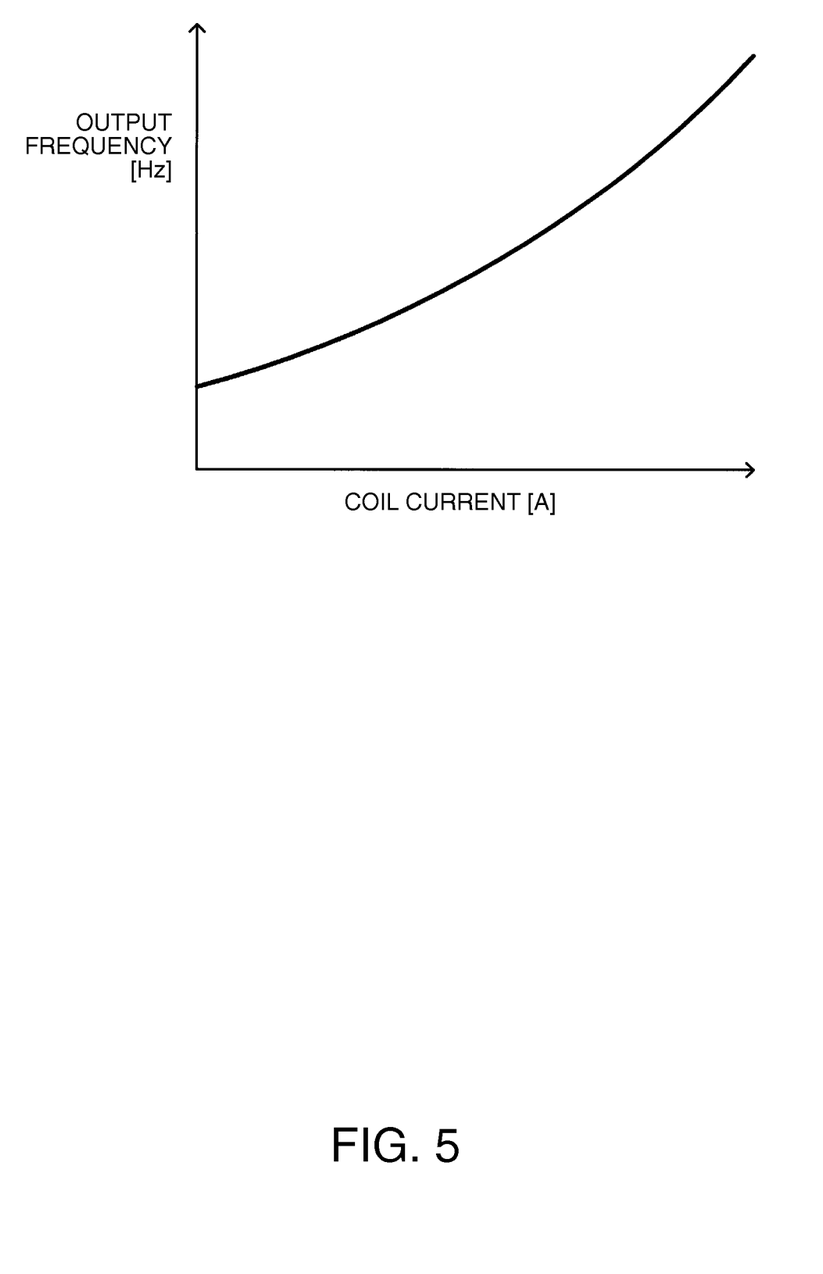
FIG. 5 is a view showing a relation between a coil current and an output frequency.

Here, the number of turns of the coil 231 and the current influence the intensity of the C magnetic field, and consequently, influence the Zeeman fission of the alkali metal atom of the gas cell 230. Especially, with respect to the current, the magnitude of the current of the coil 231 can be easily changed by changing the set value stored in the memory. FIG. 5 is a view showing a relation between the current of the coil 231 and the output frequency. As shown in FIG. 5, the output frequency is proportional to the square of the current. Thus, the output frequency of the atomic oscillator 200 can be adjusted by changing the set value of the current of the coil 231 stored in the memory.

Here, one of reasons why the output frequency adjustment is required for the atomic oscillator 200 is a manufacturing variation in pressure of a buffer gas, such as neon (Ne) or argon (Ar), injected in the gas cell 230. Since the shift amount of the resonance frequency varies by the manufacturing variation of the buffer gas, there is a possibility that the desired output frequency F (here, 10 MHz) can not be obtained.

Figure 6A:
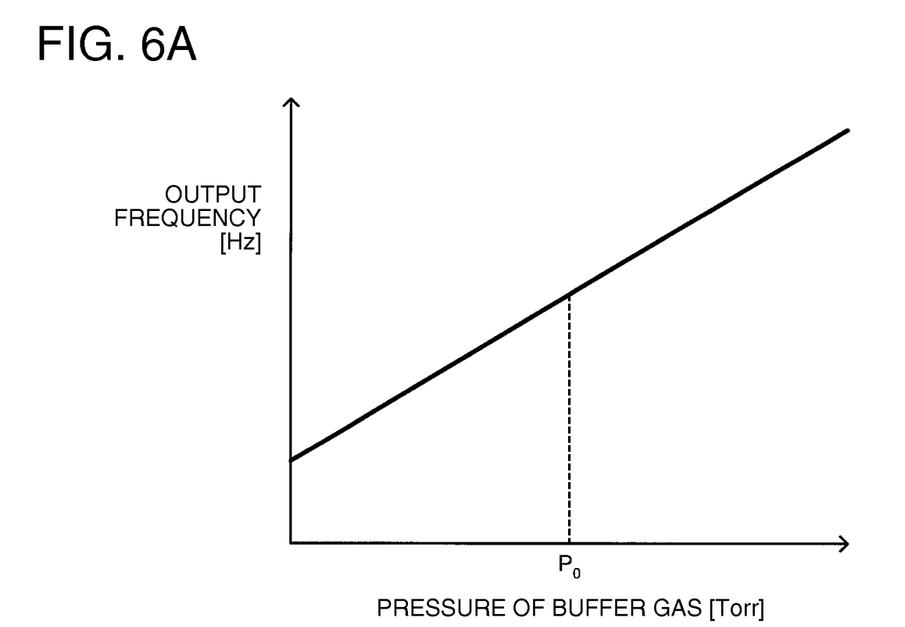
FIG. 6A is a view showing a relation between a buffer gas pressure and an output frequency.

For example, FIG. 6A is a view showing a relation between a buffer gas pressure and an output frequency. It is assumed that the desired output frequency F is obtained when the buffer gas pressure is $P_0$. However, when the buffer gas pressure becomes higher than $P_0$, the output frequency becomes higher than F (for example, 10.1 MHz), and when the buffer gas pressure becomes lower than $P_0$, the output frequency becomes lower than F (for example, 9.9 MHz).

Figure 6B:
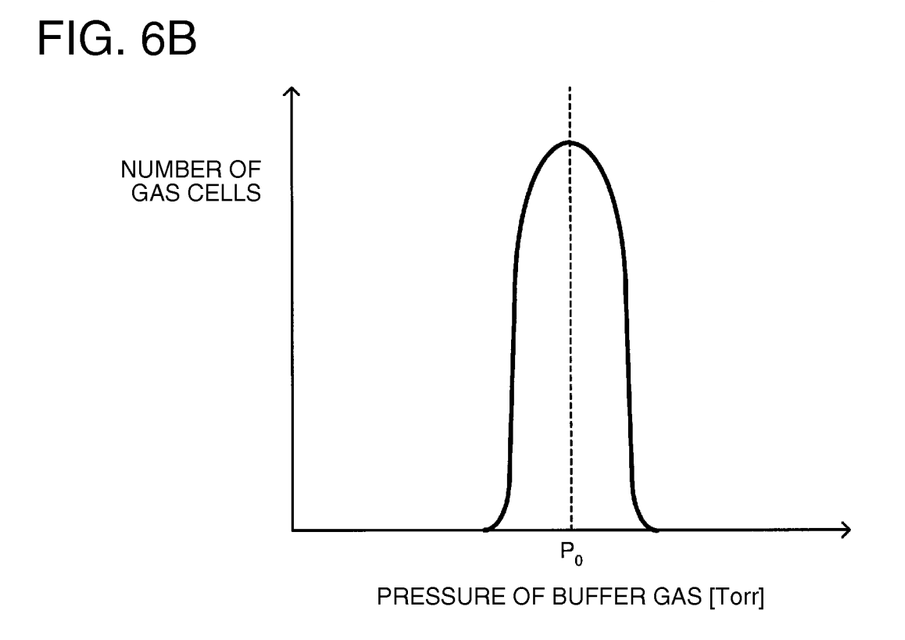
FIG. 6B is a view showing a distribution of the buffer gas pressure at the time of manufacture.

FIG. 6B is a view showing a distribution of buffer gas pressure at the time of manufacture of the atomic oscillator 200. Although the buffer gas pressures of the gas cells 230 are often $P_0$, the manufacturing variation is not zero, and one in which the buffer gas pressure is higher than $P_0$ and one in which the buffer gas pressure is lower than $P_0$ are also usually manufactured.

Thus, after the atomic oscillator 200 is assembled (adjustment stage in product manufacture), adjustment is required to obtain the desired output frequency F, and before the assembling of the atomic oscillator 200 (design stage in product manufacture), the specification of the atomic oscillator 200 is required to be determined so that the adjustment can be certainly performed. That is, the adjustment is to change the resonance frequency in order to obtain the desired output frequency.

Since the coil 231 influences the intensity of the C magnetic field by the change of the number of turns and the current, the coil can be used for the adjustment of the output frequency of the atomic oscillator 200. Thus, in the atomic oscillator 200, in view of the adjustment by the coil 231, it is preferable that n of the bit number of the decimal setting part of the PLL circuit 280 is appropriately selected, and the increase of the circuit scale is also suppressed.

Determination of Adjustment Range

Here, a range adjustable by the coil 231 is known to be approximately $R_M=10^{-9}$, where $R_M$ denotes an adjustable ratio to the resonance frequency. That is, since the resonance frequency is of GHz order, when the maximum digit of the resonance frequency adjustable by the coil 231 is a boundary digit, the boundary digit is the ones digit. That is, the coil 231 can adjust the ones digit and digits after the decimal point of the resonance frequency. Thus, it is sufficient if at least the remaining digits (digits higher than the boundary digit) of the resonance frequency can be adjusted by setting the frequency division ratio of the PLL circuit 280 of the atomic oscillator 200.

Figure 7A:
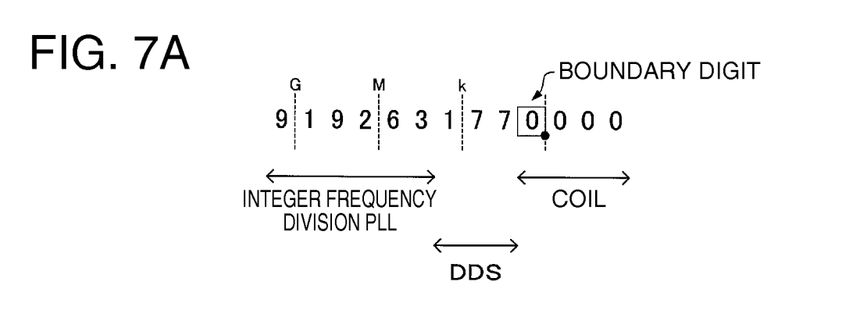
FIG. 7A is a view showing an adjustment range of an atomic oscillator using an integer frequency division PLL as a comparative example.

At this time, it is necessary that the PLL circuit 280 can adjust all digits higher than the boundary digit. For example, if the PLL circuit 280 is realized by an integer frequency divider PLL in which the frequency division ratio is an integer value, as shown in FIG. 7A, there are digits which can not be adjusted by the coil 231 and the PLL circuit 280. Thus, a DDS is required to be separately provided so that all the digits of the resonance frequency can be adjusted. In the atomic oscillator 200, since the PLL circuit 280 is the fractional N-PLL to realize frequency division by a fraction, all the digits of the resonance frequency can be adjusted by the coil 231 and the PLL circuit 280 by appropriately selecting n of the bit number of the decimal setting part.

Figure 7B:
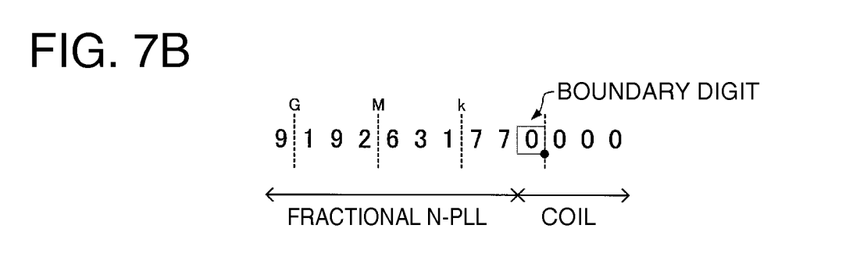
FIG. 7B is a view showing an adjustment range of the atomic oscillator of the embodiment.
Figure 7C:
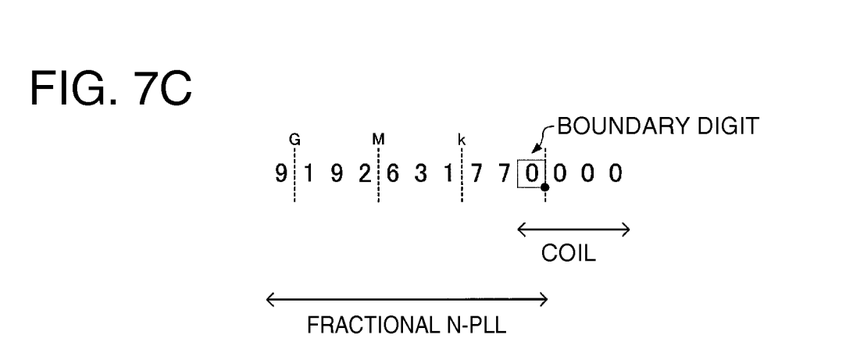
FIG. 7C is a view exemplifying an adjustment range when n is increased in the atomic oscillator of the embodiment.

For example, as shown in FIG. 7B, the PLL circuit 280 may be capable of adjusting digits not lower than the digit one digit higher than the boundary digit. Besides, as shown in FIG. 7C, the PLL circuit 280 may be capable of adjusting part of the digits adjustable by the coil 231. The bit number n of the decimal setting part of the PLL circuit 280 to enable the adjustment satisfies a relation of expression (1).

$$\frac{f_{PFD}}{2^n} \le f_{\Delta E} \times R_M \qquad (1)$$

Here, $f_{PFD}$ denotes the phase comparison frequency, $f_{\Delta E}$ denotes the resonance frequency, and $R_M$ denotes the adjustable ratio. Here, as one example, when $f_{PFD}$ is 10 MHz equal to the desired output frequency F of the VCXO 270, $R_M$ is $10^{-9}$, and $f_{\Delta E}$ is about 9 GHz of the resonance frequency of the cesium atom, n=25 satisfies the expression (1). That is, when the PLL circuit 280 including the decimal setting part of 25 bits is used, all the digits of the resonance frequency can be adjusted.

As stated before, if the frequency to the third decimal place is adjusted by only the PLL circuit 280, the decimal setting part is required to have about 34 bits. Thus, the increase of the circuit scale can be suppressed by obtaining n of the appropriate bit number of the decimal setting part based on the expression (1) in view of the relation with coil 231.

The expression (1) is especially used at the design stage in the product manufacture. Incidentally, the expression (1) is also the expression to give a specification to be satisfied by the coil 231 when n of the bit number of the decimal setting part of the PLL circuit 280 is estimated or determined. That is, the adjustable ratio $R_M$ to satisfy the expression (1) is obtained, and the coil 231 having the number of turns capable of realizing the adjustable ratio $R_M$ may be selected, or the initial value of the current of the coil 231 may be determined.

In the atomic oscillator 200 manufactured so as to satisfy the expression (1), after assembling, that is, at the adjustment stage in the product manufacture, adjustment can be performed for all the digits of the resonance frequency. Specifically, the adjustment can be performed to obtain the desired output frequency by changing the setting of the frequency division ratio of the PLL circuit 280 and the magnitude of the current of the coil.

Figure 8:
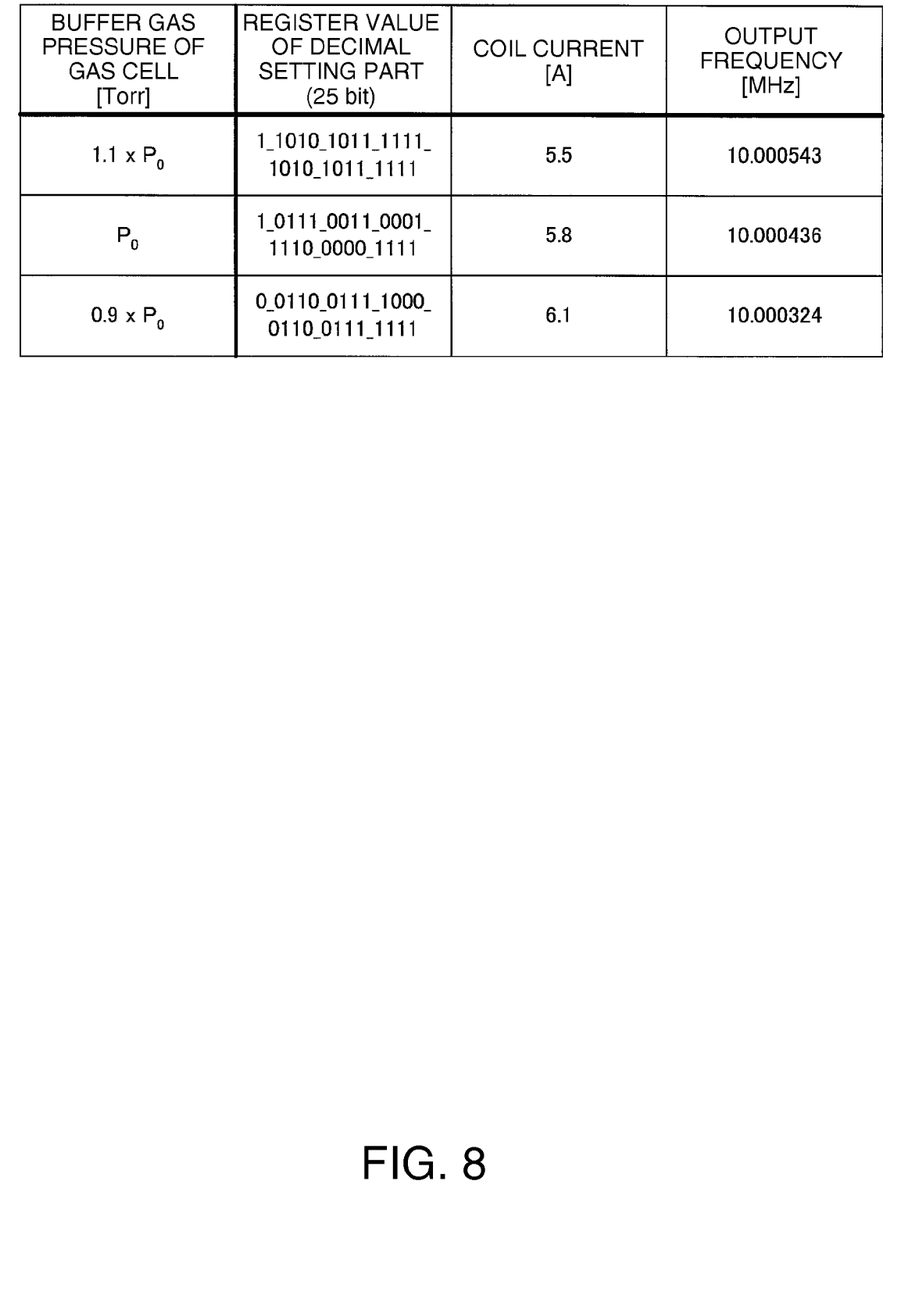
FIG. 8 is a view showing adjustment after the atomic oscillator of the embodiment is assembled.

FIG. 8 is a view exemplifying the adjustment after the assembling of the atomic oscillator of this embodiment. The drawing shows adjustment examples in which although the buffer gas pressure of the gas cell 230 is to be $P_0$, the pressure becomes $1.1 \times P_0$ and $0.9 \times P_0$ by manufacturing variation, that is, the pressure becomes high by 10% and the pressure becomes low by 10%. When the buffer gas pressure is not $P_0$, the register value of 25 bits (corresponding to the decimal part of the frequency division ratio of the PLL circuit 280) is changed from the value (initial value) of the case where the buffer gas pressure is $P_0$, and the current flowing through the coil is adjusted. For example, when the buffer gas pressure of the gas cell 230 is higher than $P_0$, the current is decreased, and in the opposite case, the current is increased.

As shown in FIG. 8, even if the buffer gas pressure of the gas cell 230 is not $P_0$ due to the manufacturing variation, the desired frequency (here, 10 MHz) can be obtained as the output frequency.

2. Manufacturing Method of the Atomic Oscillator

Figure 9:
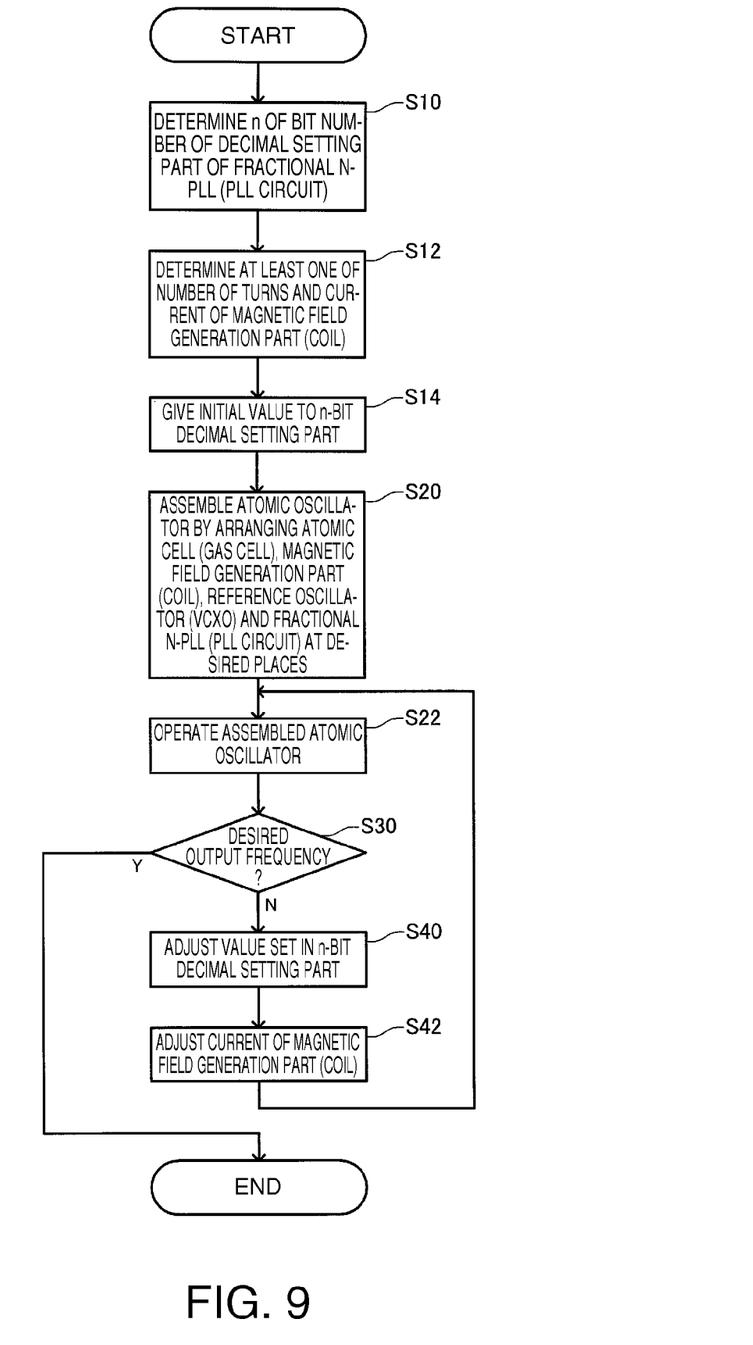
FIG. 9 is a flowchart of a manufacturing method of the atomic oscillator of the embodiment.

FIG. 9 is a flowchart of a manufacturing method of the atomic oscillator 200 of this embodiment. First, n of the bit number of the decimal setting part of the PLL circuit 280 is determined (S10). Then, at least one of the number of turns and the current of the coil 231 is determined (S12). At this time, S10 and S12 are performed based on the above-mentioned expression (1). Incidentally, only one of S10 and S12 may be performed, and the sequence may be reversed. For example, if n of the bit number of the decimal setting part is already determined, only S12 may be performed, and if the specification of the coil 231 is already determined, only S10 may be performed.

Next, the initial value is given to the n-bit decimal setting part (S14). The initial value may be a value obtained by calculation so that the desired output frequency F is obtained. Incidentally, S14 may be performed after S20 (assembling of the atomic oscillator 200) described later. S10, S12 and S14 correspond to the design stage of the product manufacture.

Next, the gas cell 230, the coil 231, the VCXO 270, the PLL circuit 280 and other required components are respectively arranged at desired places and the atomic oscillator 200 is assembled (S20). Then, the assembled atomic oscillator 200 is operated (S22).

As a result, if the desired output frequency F is obtained (S30Y), the adjustment is not required, and the series of steps are ended. If the desired output frequency F is not obtained (S30 N), the value set in the n-bit decimal setting part is adjusted (S40), and the current of the coil 231 is adjusted (S42). Here, at S40, the register value (25 bit) of the decimal setting part of FIG. 8 is adjusted to a value different from the initial value. At S50, the set value on the memory to set the magnitude of the current of the coil 231 is changed. Incidentally, at S40, although the integer part of the frequency division ratio may be adjusted, in general, adjustment up to the integer part is usually unrequired with respect to the manufacturing variation of the gas cell 230.

After these adjustments are performed, return is made again to S22, and it is determined whether the desired output frequency F is obtained (S30). Incidentally, S20, S22, S30, S40 and S42 correspond to the adjustment stage in the product manufacture.

As described above, in the atomic oscillator 200 of this embodiment, since a circuit such as a DDS is unnecessary, the waveform of the output signal does not deteriorate. The variation in the shift amount of the resonance frequency due to the manufacturing variation of the buffer gas can be adjusted for all the digits of the resonance frequency requiring adjustment, and the increase of the circuit scale can be suppressed.

3. Modified Example

Figure 10:
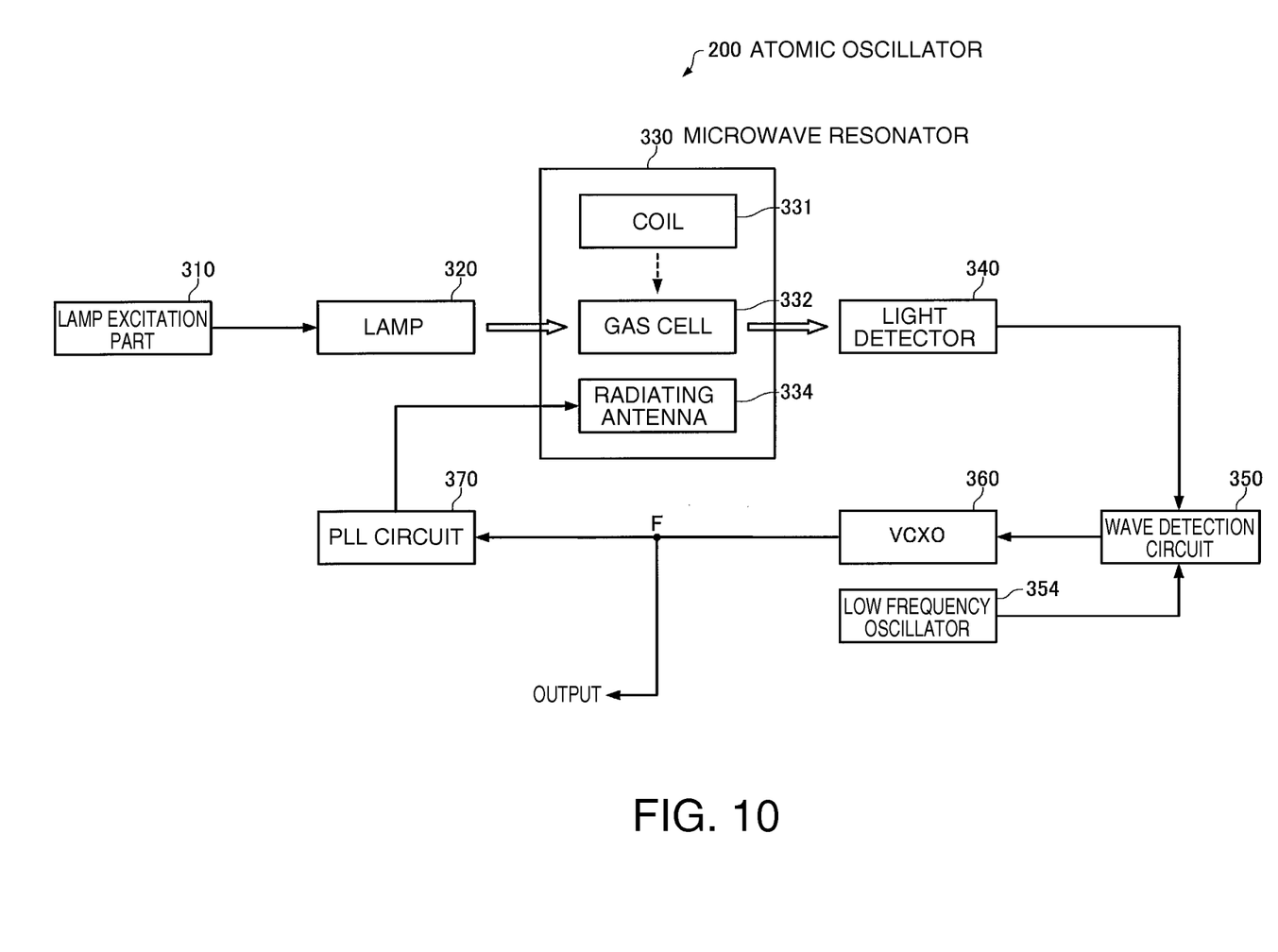
FIG. 10 is a view showing a structural example of an atomic oscillator of a modified example.

FIG. 10 is a view showing a structural example of an atomic oscillator 200 of a modified example using an optical micro double resonance phenomenon of an alkali metal atom. As shown in FIG. 10, the atomic oscillator 200 of the modified example includes a lamp exciting part 310, a lamp 320, a microwave resonator 330, a coil 331, a gas cell 332, a radiating antenna 334, a light detector 340, a wave detection circuit 350, a low frequency oscillator 354, a voltage controlled crystal oscillator (VCXO 360) and a PLL circuit 370. Incidentally, in the atomic oscillator of the embodiment, part of the structural components (respective parts) of FIG. 10 may be omitted or changed, and another structural component may be added.

The gas cell (atomic cell) 332 is such that gaseous alkali metal atoms (sodium (Na) atoms, rubidium (Rb) atoms, cesium (Cs) atoms, etc.) are enclosed in a container made of a transparent member such as glass. The gas cell 332 is contained in the microwave resonator 330.

The micro wave resonator (cavity resonator) 330 is excited at the frequency of the microwave emitted from the radiating antenna 334.

The lamp 320 is lit by the lamp exciting part 310, and generates resonant light for exciting the alkali metal atom contained in the gas cell 332. Specifically, the lamp 320 generates the light of a wavelength $\lambda_1$ corresponding to an energy difference between the excited level of the alkali metal atom enclosed in the gas cell 332 and one of ground levels. For example, when the rubidium (Rb) atom is enclosed in the gas cell 332, a rubidium lamp is used as the lamp 320. Incidentally, similarly to the coil 231, the coil 331 is for generating the C magnetic field, and a detailed description thereof is omitted.

The light passing through the gas cell 332 is incident on the light detector 340, and the light detector outputs a detection signal corresponding to the intensity of the incident light. The light detector 340 can be realized by using, for example, a photo diode (PD) to output a detection signal corresponding to the intensity of received light. The output signal of the light detector 340 is inputted to the wave detection circuit 350.

The wave detection circuit 350 uses the oscillation signal of the low frequency oscillator 354 oscillating at a low frequency of several Hz to several hundred Hz and synchronously detects the output signal of the light detector 340. The oscillation frequency of the VCXO 360 is finely adjusted according to the magnitude of the output signal of the wave detection circuit 350. The VCXO 360 may oscillate at, for example, several MHz to hundreds of thousands of MHz.

The PLL circuit 370 frequency-converts the output signal of the VCXO 360 and outputs to the radiating antenna 334. The radiating antenna 334 emits the microwave corresponding to the output frequency of the PLL circuit 370.

The microwave resonator 330 is finely adjusted by the feedback loop passing through the gas cell 332, the light detector 340, the wave detection circuit 350, the VCXO 360, the PLL circuit 370 and the radiating antenna 334, so that the microwave resonator is excited at the frequency (resonance frequency) $f_{12}$ corresponding to the energy difference $\Delta E_{12}$ between the two ground levels of the alkali metal atom enclosed in the gas cell 332. For example, if the alkali metal atom is the rubidium atom, since the resonance frequency $f_{12}$ is 6.8346826128 GHz, the resonator becomes stable in the state where the output frequency of the PLL circuit 370 is coincident with 6.8346826128 GHz.

Also in the atomic oscillator 200 of the modified example, similarly to the atomic oscillator using the EIT phenomenon of the alkali metal atom, the fractional N-PLL is used as the PLL circuit 370, and n of an appropriate bit number of the decimal setting part can be selected based on, for example, the expression (1). At this time, in the atomic oscillator 200 of the modified example, without deteriorating the waveform of the output signal, the variation in the shift amount of the resonance frequency due to the manufacturing variation of the buffer gas can be adjusted for all digits of the resonance frequency requiring adjustment, and the increase of the circuit scale can be suppressed.

4. Others

The invention includes substantially the same structure as the structure described in the embodiments (for example, a structure having the same function, method and result, or a structure having the same object and effect). Besides, the invention includes a structure in which an unessential part of the structure described in the embodiments is replaced. Besides, the invention includes a structure in which the same operation and effect as those of the structure described in the embodiments can be obtained or a structure in which the same object can be achieved. Besides, the invention includes a structure in which a well-known technique is added to the structure described in the embodiments.

The entire disclosure of Japanese Patent Application No. 2013-065633, filed Mar. 27, 2013 is expressly incorporated by reference herein.

What is claimed is:

1. An atomic oscillator comprising:
an atomic cell in which an atom is enclosed;
a magnetic field generation part to apply a magnetic field to the atomic cell;
a reference oscillator that is controlled based on an atomic resonance signal outputted from the atomic cell and generates a reference signal; and
a fractional N-PLL that receives the reference signal to generate a signal including a resonance frequency of the atom, wherein
when a maximum digit of the resonance frequency adjustable by the magnetic field generation part is a boundary digit, the fractional N-PLL is operable to adjust the resonance frequency at least a digit that is one digit higher than the boundary digit,
the fractional N-PLL includes an n-bit decimal setting part to determine a decimal part of a frequency division ratio, and
when a bit number of the decimal setting part is n, a phase comparison frequency is $f_{PFD}$, the resonance frequency is $f_{\Delta E}$, and an adjustable ratio of the magnetic field generation part to the resonance frequeny is $R_M$, following equation is satisfied $$\frac{f_{PFD}}{2^n} \le f_{\Delta E} \times R_M.$$

2. The atomic oscillator according to claim 1, wherein the fractional N-PLL includes a decimal setting part of at least 25 bits.

3. The atomic oscillator according to claim 1, wherein the fractional N-PLL is operable to adjust at least remaining digits of the resonance frequency which are higher than the boundary digit.

4. A manufacturing method of an atomic oscillator including an atomic cell in which an atom is enclosed, a magnetic field generation part as a coil to apply a magnetic field to the atomic cell, a reference oscillator that is controlled based on an atomic resonance signal outputted from the atomic cell and generates a reference signal, and a fractional N-PLL that includes an n-bit decimal setting part to determine a decimal part of a frequency division ratio and receives the reference signal to generate a signal including a resonance frequency of the atom, the method comprising:
determining n of a bit number of the decimal setting part of the fractional N-PLL, wherein when a maximum digit of the resonance frequency adjustable by the magnetic field generation part is a boundary digit, the fractional N-PLL can adjust at least a digit one digit higher than the boundary digit, and when a bit number of the decimal setting part is n, a phase comparison frequency is $f_{PFD}$, the resonance frequency is $f_{\Delta E}$ and an adjustable ratio of the magnetic field generation part to the resonance frequency is $R_M$, following equation is satisfied $$\frac{f_{PFD}}{2^n} \le f_{\Delta E} \times R_M.$$

5. The manufacturing method of the atomic oscillator according to claim 4, further comprising:
giving an initial value to the n-bit decimal setting part of the fractional N-PLL; and
adjusting the value set in the decimal setting part.

6. The manufacturing method of the atomic oscillator according to claim 4, further comprising
adjusting the current of the magnetic field generation part.

7. A manufacturing method of an atomic oscillator including an atomic cell in which an atom is enclosed, a magnetic field generation part as a coil to apply a magnetic field to the atomic cell, a reference oscillator that is controlled based on an atomic resonance signal outputted from the atomic cell and generates a reference signal, and a fractional N-PLL that includes an n-bit decimal setting part to determine a decimal part of a frequency division ratio and receives the reference signal to generate a signal including a resonance frequency of the atom, the method comprising:
determining at least one of a number of turns and a current of the magnetic field generation part such that the magnetic field generation part can adjust at least a digit not higher than a boundary digit of the resonance frequency, the boundary digit being a digit one digit lower than a minimum digit of the resonance frequency adjustable by the fractional N-PLL, and when a bit number of the decimal setting part is n, a phase comparison frequency is $f_{PFD}$, the resonance frequency is $f_{\Delta E}$, and an adjustable ratio of the magnetic field generation part to the resonance frequency is $R_M$, following equation is satisfied $$\frac{f_{PFD}}{2^n} \le f_{\Delta E} \times R_M.$$

8. The manufacturing method of the atomic oscillator according to claim 7, further comprising:
   giving an initial value to the n-bit decimal setting part of the fractional N-PLL; and
   adjusting the value set in the decimal setting part.

9. The manufacturing method of the atomic oscillator according to claim 7, further comprising
   adjusting the current of the magnetic field generation part.

* * * * *